(12) United States Patent
Fang et al.

(10) Patent No.: US 7,274,244 B2
(45) Date of Patent: Sep. 25, 2007

(54) PULSE MULTIPLEXED OUTPUT SYSTEM

(75) Inventors: Wayne Fang, Pleasanton, CA (US);
Wayne S. Richardson, Saratoga, CA (US); Kurt T. Knorpp, San Carlos, CA (US)

(73) Assignee: Rambus Inc., Los Altos, CA (US)

( * ) Notice: Subject to any disclaimer, the term of this patent is extended or adjusted under 35 U.S.C. 154(b) by 77 days.

(21) Appl. No.: 11/123,225

(22) Filed: May 6, 2005

(65) Prior Publication Data

US 2005/0248383 A1 Nov. 10, 2005

Related U.S. Application Data

(60) Provisional application No. 60/568,242, filed on May 6, 2004.

(51) Int. Cl.
*H03K 17/00* (2006.01)

(52) U.S. Cl. .................. 327/407; 327/359

(58) Field of Classification Search .......... 327/407, 327/408, 99
See application file for complete search history.

(56) References Cited

U.S. PATENT DOCUMENTS

| | | | |
|---|---|---|---|
| 6,188,339 B1 * | 2/2001 | Hasegawa | 341/101 |
| 6,239,646 B1 * | 5/2001 | Navabi et al. | 327/407 |
| 6,381,684 B1 | 4/2002 | Hronik et al. | |
| 6,531,910 B1 * | 3/2003 | Krawczyk et al. | 327/407 |
| 6,591,349 B1 | 7/2003 | Steinman et al. | |
| 6,636,077 B1 * | 10/2003 | Chang et al. | 326/105 |
| 6,647,456 B1 | 11/2003 | Van Dyke et al. | |
| 2002/0113638 A1 | 8/2002 | Takauchi et al. | |
| 2002/0125933 A1 | 9/2002 | Tamura et al. | |
| 2003/0076821 A1 | 4/2003 | Takauchi et al. | |
| 2003/0201799 A1 | 10/2003 | Takauchi et al. | |

OTHER PUBLICATIONS

Kun-Yung Ken Chang, "A 50 Gb/s 32×32 CMOS Crossbar Chip using Asymmetric Serial Links", Symposium on VLSI Circuits Digest of Technical Papers, pp. 19-22, 1999.
Outline, IEEE International Solid-State Circuits Conference, 2001.
Stefanos Sidiropoulos, et al., IEEE International Solid-State Circuits Conference, pp. 70-72, 2001.

(Continued)

*Primary Examiner*—Kenneth B. Wells
*Assistant Examiner*—Ryan Jager
(74) *Attorney, Agent, or Firm*—Hunton & Williams LLP

(57) ABSTRACT

A pulse multiplexed output subsystem is disclosed. In one particular exemplary embodiment, the output subsystem may comprise a plurality of pulse generators, a first pair of transistors, and a second pair of transistors, wherein each of the first pair of transistors is coupled to a respective one of a first pair of the plurality of pulse generators, and wherein each of the second pair of transistors is coupled to a respective one of a second pair of the plurality of pulse generators. The output subsystem may also comprise a first pair of resistive loads, wherein each of the first pair of resistive loads is coupled to a respective one of the first pair of transistors and a respective one of the second pair of transistors, and a first current source coupled to the first pair of transistors and the second pair of transistors.

20 Claims, 8 Drawing Sheets

OTHER PUBLICATIONS

Kun-Yung Ken Chang, et al., Symposium on VLSI Circuits Digest of Technical Papers, 2002.

Kun-Yung Ken Chang, "A 2Gb/s/pin CMOS Asymmetric Serial Link", Symposium on VLSI Circuits Digest of Technical Papers, pp. 216-217, 1998.

Alan Fiedler, "FP 15.1: A 1.06225Gbps Transceiver with 2x-Oversampling and Transmit Signal Pre-Emphasis", IEEE, 1997.

Alan Fiedler, "FP 15.1: A 1.06225Gbps Transceiver with 2x-Oversampling and Transmit Signal Pre-Emphasis", IEEE, ISSCC Slide Supplement, ISSCC97, Session 15/Serial Data Communications/Paper FP 15.1, 1997.

Hideki Takauchi et al., "A CMOS Multichannel 10-Gb/s Transceiver", IEEE Journal of Solid-State Circuits, vol. 38, No. 12, Dec. 2003.

* cited by examiner

PULSE MULTIPLEXED OUTPUT SYSTEM

CROSS-REFERENCE TO RELATED APPLICATIONS

This patent application claims priority to U.S. Provisional Patent Application No. 60/568,242, filed May 6, 2004, which is hereby incorporated by reference herein in its entirety.

FIELD OF THE DISCLOSURE

The present disclosure relates generally to high speed data transmission and, more particularly, to a pulse multiplexed output subsystem.

BACKGROUND OF THE DISCLOSURE

Low core data path operating frequencies can provide significant power reduction as well as relaxed circuit design requirements for power critical dynamic random access memory (DRAM) systems. However, it is difficult to maintain a low latency high performance output channel data rate since several slower data streams must be multiplexed and level shifted into the output channel in as few stages as possible. Therefore, a practical architecture for a multi-data stream environment is desirable.

Referring to FIG. 1, there is shown a conventional output subsystem 100 comprising a plurality of preconditioning driver circuits 102, a plurality of cross-coupled transistor stacks 104, a first current source 106, a first pair of resistive loads 108, a pair of transistors 110 forming a differential output driver, a second pair of resistive loads 112, and a second current source 114. Each of the plurality of preconditioning driver circuits 102 receives an input data signal (e.g., D1) and quadrature clock signals (i.e., CLKI, /CLKI, CLKQ, and /CLKQ), and generates a pair of output data signals that are phase shifted 90° based thereon.

Referring to FIG. 2, there is shown a preconditioning driver circuit 200 that may be used as one or more of the plurality of preconditioning driver circuits 102 shown in FIG. 1. The preconditioning driver circuit 200 comprises a plurality of inverter devices 202, as well as a plurality of transmission gates each comprising an NMOS transistor 204 and a PMOS transistor 206. As described above with reference to FIG. 1, the preconditioning driver circuit 200 receives an input data signal (e.g., D1) and quadrature clock signals (i.e., CLKI, /CLKI, CLKQ, and /CLKQ), and generates a pair of output data signals ($D1_A$ and $D1_B$) that are phase shifted 90° based thereon.

Referring again to FIG. 1, each pair of 90° phase shifted output data signals that are generated by a respective one of the plurality of preconditioning driver circuits 102 are provided to a respective one of the plurality of cross-coupled transistor stacks 104. Each of the plurality of cross-coupled transistor stacks 104 receives a pair of 90° phase shifted output data signals from a respective one of the plurality of preconditioning driver circuits 102, and generates an output driver control signal via current paths formed with the first current source 106 and one of the first pair of resistive loads 108. A complement of each output driver control signal is also generated by a corresponding one of the plurality of cross-coupled transistor stacks 104 such that four pairs of complementary output driver control signals are generated by the entire plurality of cross-coupled transistor stacks 104.

Referring to FIG. 3, there is shown a cross-coupled transistor stack 300 that may be used as one or more of the plurality of cross-coupled transistor stacks 104 shown in FIG. 1. The cross-coupled transistor stack 300 comprises a plurality of NMOS transistors 302 electrically connected in a cross-coupled manner. As described above with reference to FIG. 1, the cross-coupled transistor stack 300 receives a pair of 90° phase shifted output data signals ($D_A$ and $D_B$) from a respective one of the plurality of preconditioning driver circuits 102, and generates an output driver control signal via current paths formed with the first current source 106 and one of the first pair of resistive loads 108.

Referring again to FIG. 1, each pair of complementary output driver control signals generated by a corresponding pair of cross-coupled transistor stacks 104 is provided as inputs to the pair of transistors 110 forming the differential output driver. The pair of transistors 110 forming the differential output driver receive each pair of complementary output driver control signals generated by a corresponding pair of cross-coupled transistor stacks 104, and generate a pair of differential output signals (DQ and DQN) via current paths formed with the second current source 114 and the second pair of resistive loads 112.

The conventional output subsystem 100 is typically designed with a logic process where threshold voltages for NMOS transistors are relatively low and thus multiple transistor stacks are allowed. However, larger threshold voltages for NMOS transistors in other logic processes may make saturation margins difficult to meet. In addition, larger current draws required to drive larger differential output driver transistors would cause transistor sizes in the cross-coupled transistor stacks to grow, due to poor IDS characteristics. This would result in excessive drain-bulk parasitic capacitance values which would preclude the use of a similar architecture. Increasing transistor sizes in the cross-coupled transistor stacks to compensate for a larger capacitive load would simply increase the drain-bulk capacitance load, thus essentially resulting in a zero-sum gain.

Referring to FIG. 4, there is shown an alternative output subsystem 400, which is essentially identical to the conventional output subsystem 100 of FIG. 1 except for the connection of the first pair of resistive loads 108 to VDD instead of VDDIO and the addition of a pair of common-source amplifiers 402. The connection of the first pair of resistive loads 108 to VDD instead of VDDIO allows the plurality of cross-coupled transistor stacks 104 to have a larger overhead voltage and makes it easier to keep the transistors in the plurality of cross-coupled transistor stacks 104 in saturation. A level shift towards VDDIO is accomplished through the pair of common-source amplifiers 402. For example, referring to FIG. 5, there is shown a common-source amplifier 500 comprising a PMOS transistor 502 and an NMOS transistor 504. However, the power consumption of such a common-source amplifier 500 would cause the output subsystem 500 to reach approximately 60 milliwatt (mW) stand-by power, which is not acceptable in many applications.

In view of the foregoing, it would be desirable to provide an output subsystem which overcomes the above-described inadequacies and shortcomings.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

A pulse multiplexed output subsystem is disclosed. In one particular exemplary embodiment, the output subsystem may comprise a plurality of pulse generators, a first pair of transistors, and a second pair of transistors, wherein each of the first pair of transistors is coupled to a respective one of a first pair of the plurality of pulse generators, and wherein each of the second pair of transistors is coupled to a respective one of a second pair of the plurality of pulse generators. The output subsystem may also comprise a first pair of resistive loads, wherein each of the first pair of resistive loads is coupled to a respective one of the first pair of transistors and a respective one of the second pair of transistors, and a first current source coupled to the first pair of transistors and the second pair of transistors.

In another particular exemplary embodiment, the output subsystem may comprise a plurality of pulse generators, a first differential transistor pair, and a second differential transistor pair, wherein each transistor in the first differential transistor pair is coupled to a respective one of a first pair of the plurality of pulse generators, and wherein each transistor in the second differential transistor pair is coupled to a respective one of a second pair of the plurality of pulse generators. The output subsystem may also comprise a first pair of resistive loads, wherein each resistive load in the first pair of resistive loads is coupled to a respective transistor in the first differential transistor pair and a respective transistor in the second differential transistor pair, and a first current source coupled to the first differential transistor pair and the second differential transistor pair.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Figure 6:
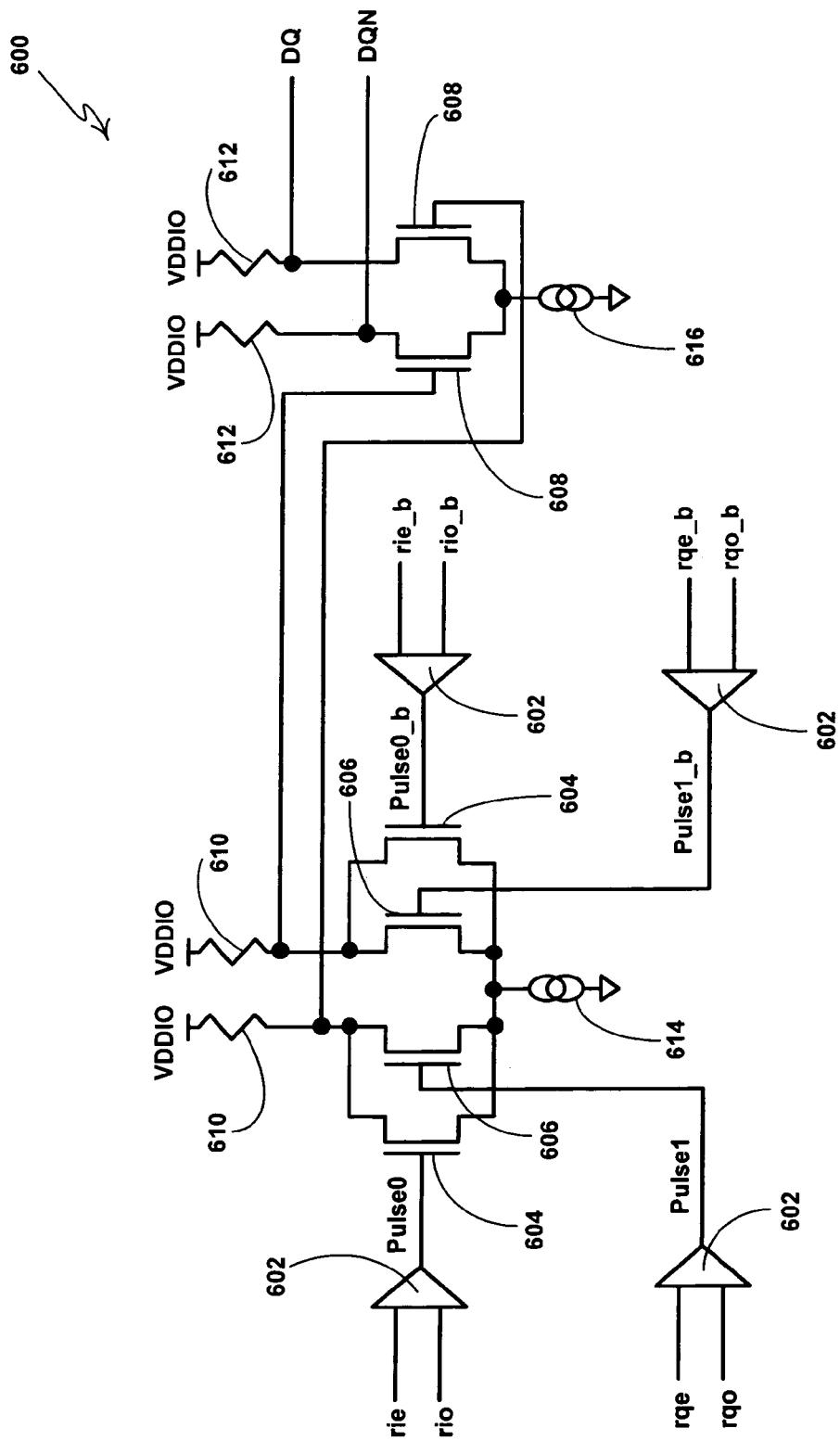
FIG. 6 shows an output subsystem in accordance with an embodiment of the present disclosure.

Referring to FIG. 6, there is shown output subsystem 600 in accordance with an embodiment of the present disclosure. The output subsystem 600 comprises a plurality of pulse generators 602, a first pair of transistors 604 forming a first differential transistor pair, a second pair of transistors 606 forming a second differential transistor pair, a third pair of transistors 608 forming a differential output driver, a first pair of resistive loads 610, a second pair of resistive loads 612, a first current source 614, and a second current source 616.

Each of the plurality of pulse generators 602 receives a pair of input data signals (i.e., rie and rio, rqe and rqo, rie_b and rio_b, and rqe_b and rqo_b) and quadrature clock signals (i.e., clki, clkib, clkq, and clkqb, not shown), and generates an output data signal (i.e., Pulse0, Pulse1, Pulse0_b, or Pulse1_b). The output data signals (i.e., Pulse0 and Pulse0_b) from a first pair of pulse generators 602 are complementary to each other. Likewise, the output data signals (i.e., Pulse1 and Pulse1_b) from a second pair of pulse generators 602 are complementary to each other.

Figure 7:
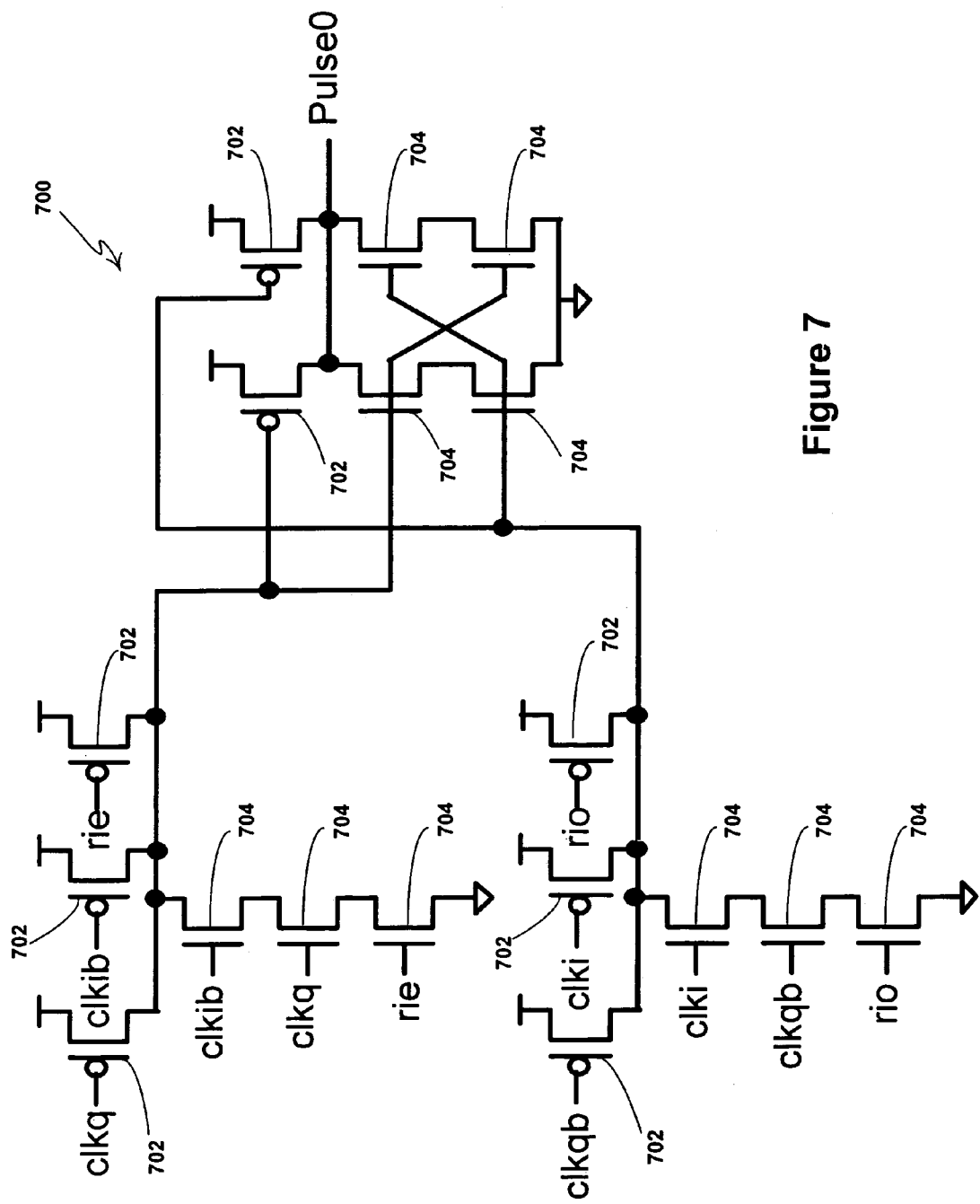
FIG. 7 shows a pulse generator that may be used as one or more of the plurality of pulse generators shown in FIG. 6.

Referring to FIG. 7, there is shown a pulse generator 700 that may be used as one or more of the plurality of pulse generators 602 shown in FIG. 6 (e.g., the pulse generator 602 receiving input data signals rie and rio, and generating output data signal Pulse0). The pulse generator 700 comprises a plurality of PMOS transistors 702 and a plurality of NMOS transistors 704. As described above with reference to FIG. 6, the pulse generator 700 receives input data signals (i.e., rie and rio) and quadrature clock signals (i.e., clki, clkib, clkq, and clkqb), and generates an output data signal (i.e., Pulse0). The pulse generator 700 may be modified slightly for each pulse generator 602 shown in FIG. 6 so that complementary output data signals (i.e., Pulse0 and Pulse0_b) from the first pair of pulse generators 602 and complementary output data signals (i.e., Pulse1 and Pulse1_b) from the second pair of pulse generators 602 are not simultaneously generated. That is, the pulse generator 700 may be modified slightly for each pulse generator 602 shown in FIG. 6 so that at any given time only one output data signal is active high.

Referring again to FIG. 6, the complementary output data signals (i.e., Pulse0 and Pulse0_b) from the first pair of pulse generators 602 are provided to the first pair of transistors 604 forming the first differential transistor pair. Likewise, the complementary output data signals (i.e., Pulse1 and Pulse1_b from the second pair of pulse generators 602 are provided to the second pair of transistors 606 forming the second differential transistor pair. Based upon the complementary output data signals, both the first pair of transistors 604 forming the first differential transistor pair and the second pair of transistors 606 forming the second differential transistor pair may generate a pair of complementary output driver control signals via current paths formed with the first pair of resistive loads 610 and the first current source 614.

Each pair of complementary output driver control signals generated by the first pair of transistors 604 forming the first differential transistor pair and the second pair of transistors 606 forming the second differential transistor pair is provided as inputs to the pair of transistors 608 forming the differential output driver. The pair of transistors 608 forming the differential output driver receive each pair of complementary output driver control signals generated by the first pair of transistors 604 forming the first differential transistor pair and the second pair of transistors 606 forming the second differential transistor pair, and generate a pair of differential output signals (DQ and DQN) via current paths formed with the second pair of resistive loads 612 and the second current source 616.

Figure 8:
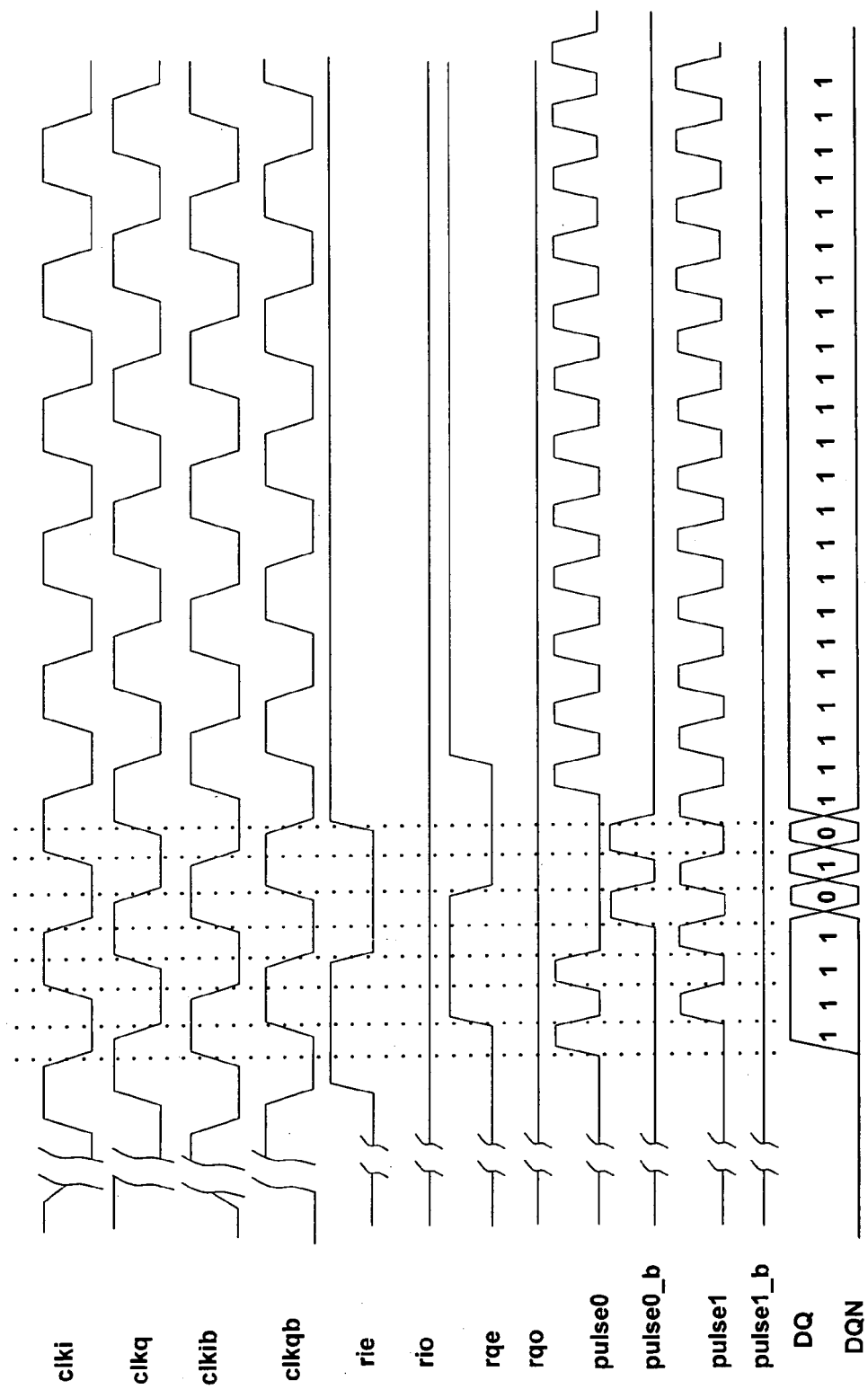
FIG. 8 shows a timing diagram illustrating the operation of the output subsystem of FIG. 6.

Referring to FIG. 8, there is shown a timing diagram illustrating the operation of the output subsystem 600 of FIG. 6. That is, FIG. 8 illustrates an example of how the quadrature clock signals (i.e., clki, clkib, clkq, and clkqb) are used to generate the output data signals (i.e., Pulse0, Pulse1, Pulse0_b, and Pulse1_b) from the input data signals (i.e., rie and rio, rqe and rqo, rie_b and rio_b, and rqe_b and rqo_b). As shown in the example of FIG. 8, the values of the input data signals (i.e., rie and rio, rqe and rqo, rie_b and rio_b, and rqe_b and rqo_b) determine the values of the output data signals (i.e., Pulse0, Pulse1, Pulse0_b, and Pulse1_b). However, the quadrature clock signals (i.e., clki, clkib, clkq, and clkqb) are used to insure that at any given time only one output data signal is active high.

In one particular exemplary embodiment, the output subsystem 600 of FIG. 6 may be used to multiplex four 800 megabit per second (Mb/s) data streams (i.e., rie, rio, rqe, rqo) onto a 3.2 gigabit per second (Gb/s) output channel. The pulse generators 602 may use the quadrature clock signals (i.e., clki, clkib, clkq, and clkqb) to precondition the input data signals (i.e., rie and rio, rqe and rqo, rie_b and rio_b, and rqe_b and rqo_b) into 3.2 Gb/s bit times. The 3.2 Gb/s pulse trains may then be multiplexed into a single 3.2 Gb/s data stream. The 3.2 Gb/s data stream may then be presented to the differential output driver (i.e., 608) for generation of the pair of differential output signals (DQ and DQN) via the current paths formed with the second pair of resistive loads 612 and the second current source 616.

Figure 1:
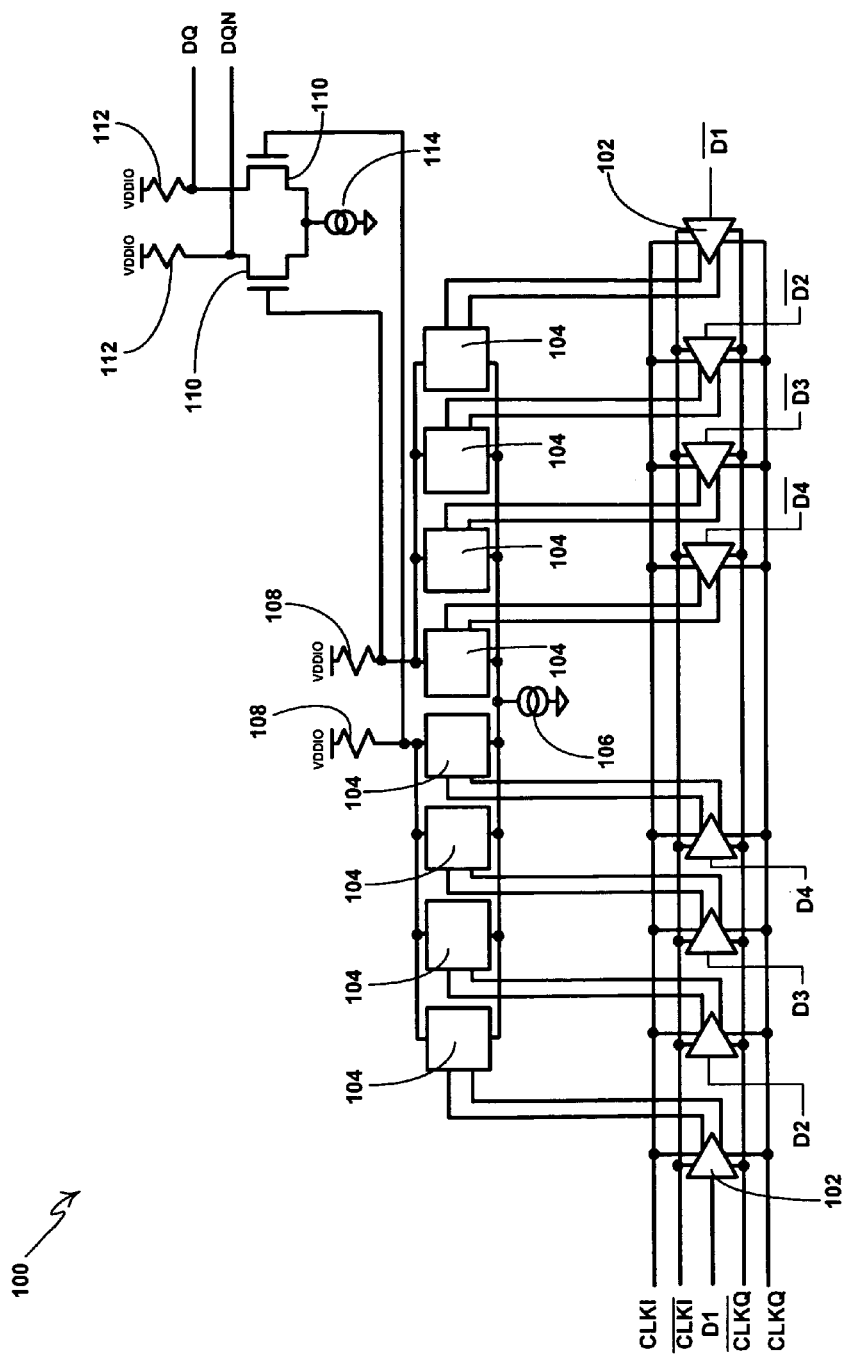
FIG. 1 shows a conventional output subsystem.
Figure 2:
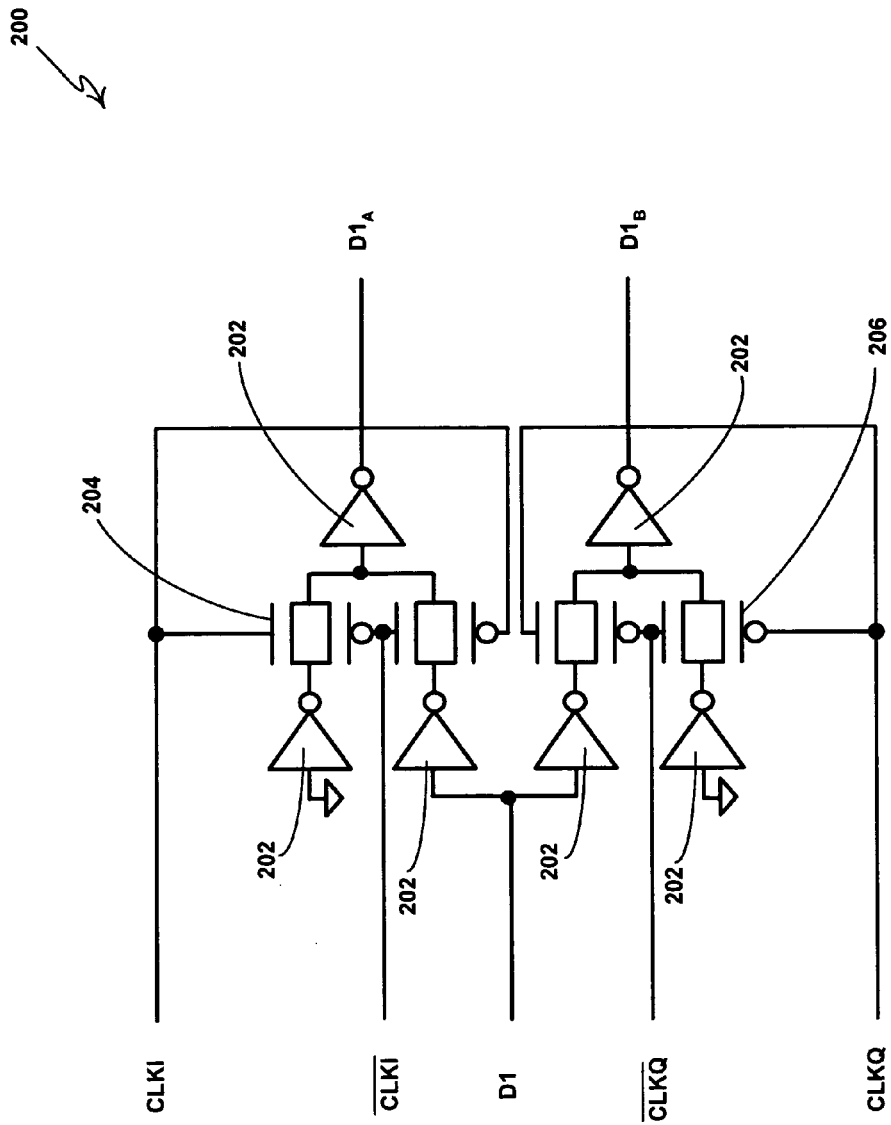
FIG. 2 shows a preconditioning driver circuit that may be used as one or more of the plurality of preconditioning driver circuits shown in FIG. 1.
Figure 3:
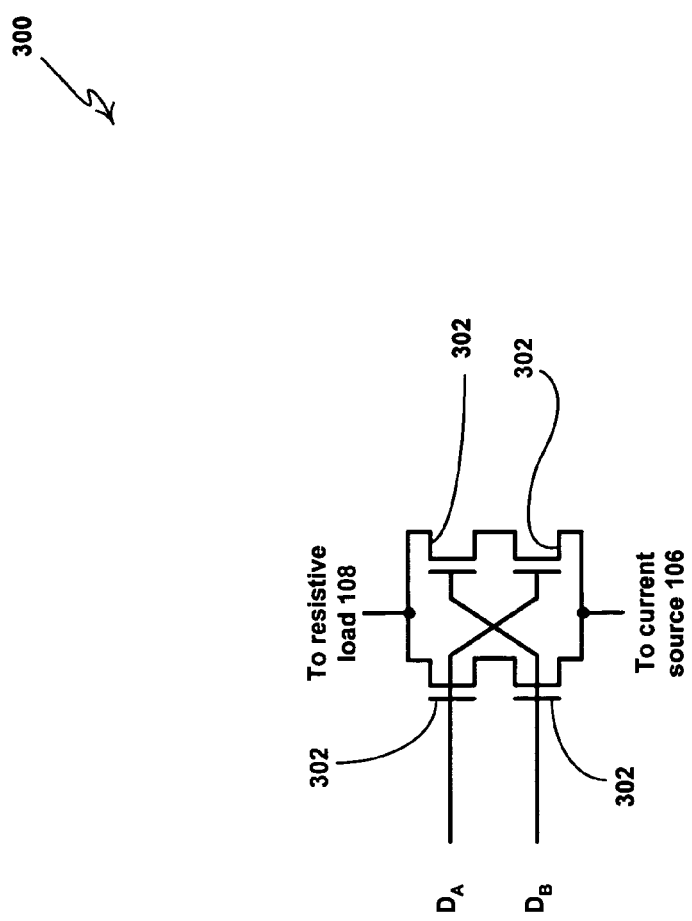
FIG. 3 shows a cross-coupled transistor stack that may be used as one or more of the plurality of cross-coupled transistor stacks shown in FIG. 1.
Figure 4:
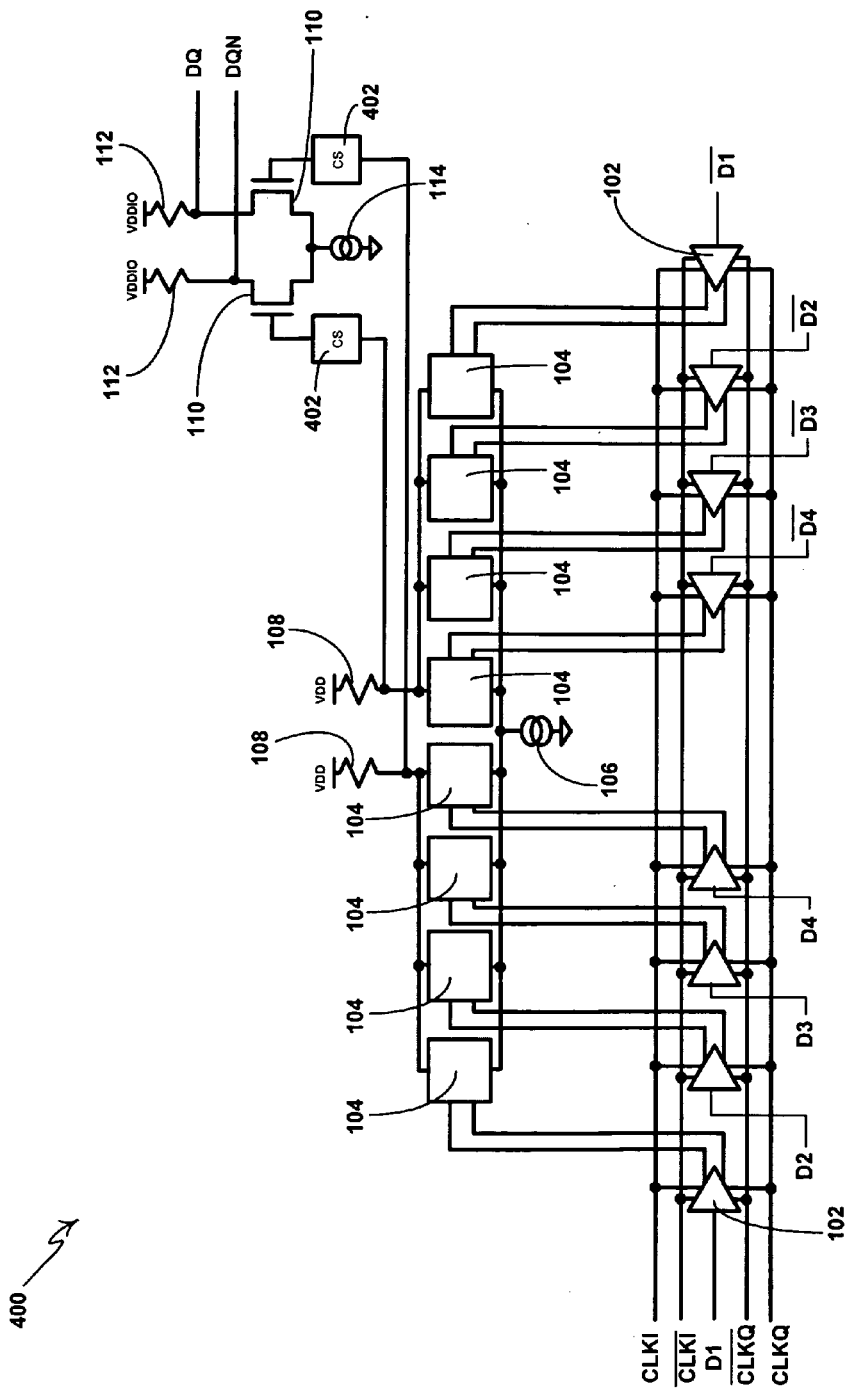
FIG. 4 shows an alternative output subsystem.
Figure 5:
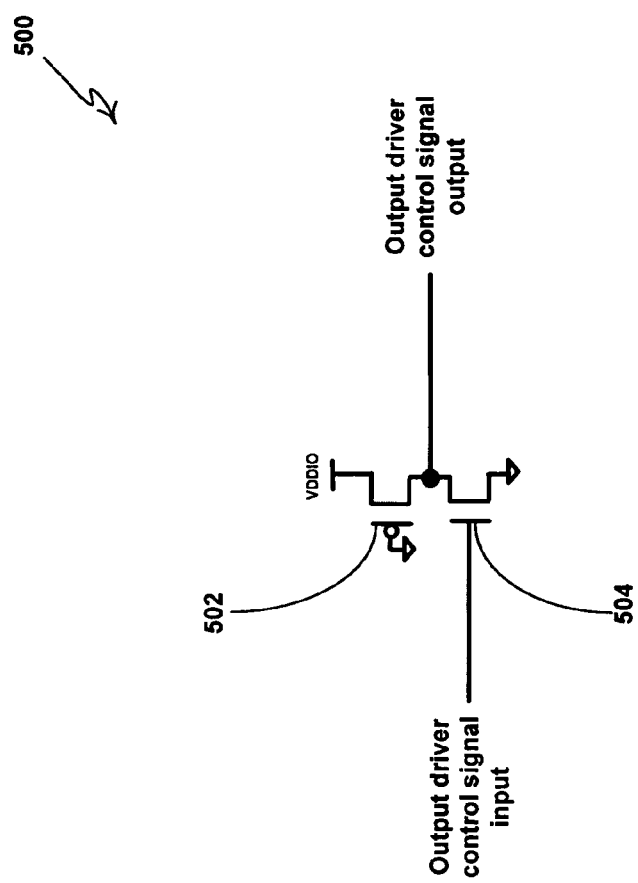
FIG. 5 shows a common-source amplifier that may be used as one or more of the pair of common-source amplifiers shown in FIG. 4.

At this point it should be noted that the maximum frequency performance of the output subsystem 600 of FIG. 6 is higher than that which can be achieved with conventional output subsystems due to the lower output capacitance of the pulse generators 602 and the differential transistor pairs (i.e., 04 and 606). In addition to increased maximum frequency performance, due to the smaller number of output stages, the output subsystem 600 of FIG. 6 may have a clock-to-output propagation delay range of 200-300 picoseconds (ps) depending upon process, voltage, and temperature variations. Furthermore, in comparison to the 60 mW stand-by power consumption associated with the output subsystem 500 of FIG. 5, the output subsystem 600 of FIG. 6 may consume as little as, and possibly less than, 24 mW stand-by power.

In summary, the present disclosure sets forth an output subsystem architecture using quadrature clocked pulse generators to multiplex and level shift several data streams onto a different output channel. The architecture is ideally suited for multi-threaded data stream systems (e.g., RDRAM, XDR, XIO, etc.) which serialize four data streams onto a differential output signaling scheme. Such an architecture may be implemented in, for example, an integrated circuit such as a memory device.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the following appended claims. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A pulse multiplexed output subsystem comprising:
    a plurality of pulse generators, each of the plurality of pulse generators to receive a respective pair of a plurality of input signals, each of the plurality of pulse generators to also receive a plurality of quadrature clock signals;
    a first pair of transistors, wherein a gate of each transistor in the first pair of transistors is coupled to an output of a respective one of a first pair of the plurality of pulse generators;
    a second pair of transistors, wherein a gate of each transistor in the second pair of transistors is coupled to an output of a respective one of a second pair of the plurality of pulse generators;
    a first pair of resistive loads, each resistive load in the first pair of resistive loads coupled to a respective one of the first pair of transistors and a respective one of the second pair of transistors; and
    a first current source coupled to the first pair of transistors and the second pair of transistors.

2. The output subsystem of claim 1, wherein each of the plurality of pulse generators comprises:
    a first group of serially connected transistors to receive a first input signal from the respective pair of the plurality of input signals and a first pair of the plurality of quadrature clock signals;
    a first group of parallel connected transistors, coupled to the first group of serially connected transistors, to receive the first input signal from the respective pair of the plurality of input signals and the first pair of the plurality of quadrature clock signals;
    a second group of serially connected transistors to receive a second input signal from the respective pair of the plurality of input signals and a second pair of the plurality of quadrature clock signals; and
    a second group of parallel connected transistors, coupled to the second group of serially connected transistors, to receive the second input signal from the respective pair of the plurality of input signals and the second pair of the plurality of quadrature clock signals.

3. The output subsystem of claim 2, wherein each of the plurality of pulse generators further comprises:
    a cross-coupled transistor stack;
    a first switching device coupled to the first group of serially connected transistors, the first group of parallel connected transistors, and to the cross-coupled transistor stack; and
    a second switching device coupled to coupled to the second group of serially connected transistors, the second group of parallel connected transistors, and to the cross-coupled transistor stack.

4. The output subsystem of claim 1, wherein the respective pairs of the plurality of input signals to be received by the first pair of the plurality of pulse generators are complements of each other.

5. The output subsystem of claim 1, wherein the respective pairs of the plurality of input signals to be received by the second pair of the plurality of pulse generators are complements of each other.

6. The output subsystem of claim 1, wherein the first pair of transistors form a first differential transistor pair.

7. The output subsystem of claim 1, wherein the second pair of transistors form a second differential transistor pair.

8. The output subsystem of claim 1, further comprising:
a third pair of transistors, each transistor in the third pair of transistors coupled to a respective one of the first pair of resistive loads.

9. The output subsystem of claim 8, further comprising:
a second pair of resistive loads, each resistor in the second pair of resistive loads coupled to a respective one of the third pair of transistors.

10. The output subsystem of claim 8, further comprising:
a second current source coupled to each transistor in the third pair of transistors.

11. A pulse multiplexed output subsystem comprising:
a plurality of pulse generators, each of the plurality of pulse generators to receive a respective pair of a plurality of input signals, each of the plurality of pulse generators to also receive a plurality of quadrature clock signals;
a first differential transistor pair, wherein a gate of each transistor in the first differential transistor pair is coupled to an output of a respective one of a first pair of the plurality of pulse generators;
a second differential transistor pair, wherein a gate of each transistor in the second differential transistor pair is coupled to an output of a respective one of a second pair of the plurality of pulse generators;
a first pair of resistive loads, each resistive load in the first pair of resistive loads coupled to a respective transistor in the first differential transistor pair and a respective transistor in the second differential transistor pair; and
a first current source coupled to the first differential transistor pair and the second differential transistor pair.

12. The output subsystem of claim 11, wherein each of the plurality of pulse generators comprises:
a first group of serially connected transistors to receive a first input signal from the respective pair of the plurality of input signals and a first pair of the plurality of quadrature clock signals;
a first group of parallel connected transistors, coupled to the first group of serially connected transistors, to receive the first input signal from the respective pair of the plurality of input signals and the first pair of the plurality of quadrature clock signals;
a second group of serially connected transistors to receive a second input signal from the respective pair of the plurality of input signals and a second pair of the plurality of quadrature clock signals; and
a second group of parallel connected transistors, coupled to the second group of serially connected transistors, to receive the second input signal from the respective pair of the plurality of input signals and the second pair of the plurality of quadrature clock signals.

13. The output subsystem of claim 12, wherein each of the plurality of pulse generators further comprises:
a cross-coupled transistor stack;
a first switching device coupled to the first group of serially connected transistors, the first group of parallel connected transistors, and to the cross-coupled transistor stack; and
a second switching device coupled to coupled to the second group of serially connected transistors, the second group of parallel connected transistors, and to the cross-coupled transistor stack.

14. The output subsystem of claim 11, wherein the respective pairs of the plurality of input signals to be received by the first pair of the plurality of pulse generators are complements of each other.

15. The output subsystem of claim 11, wherein the respective pairs of the plurality of input signals to be received by the second pair of the plurality of pulse generators are complements of each other.

16. The output subsystem of claim 11, further comprising:
a third differential transistor pair, each transistor in the third differential transistor pair coupled to a respective one of the first pair of resistive loads.

17. The output subsystem of claim 16, further comprising:
a second pair of resistive loads, each resistor in the second pair of resistive loads coupled to a respective transistor in the third differential transistor pair.

18. The output subsystem of claim 16, further comprising:
a second current source coupled to each transistor in the third differential transistor pair.

19. A pulse multiplexed output subsystem comprising:
a plurality of pulse generators, each of the plurality of pulse generators to receive a respective pair of a plurality of input signals;
a first pair of transistors, wherein a gate of each transistor in the first pair of transistors is coupled to an output of a respective one of a first pair of the plurality of pulse generators;
a second pair of transistors, wherein a gate of each transistor in the second pair of transistors is coupled to an output of a respective one of a second pair of the plurality of pulse generators;
a first pair of resistive loads, each resistive load in the first pair of resistive loads coupled to a respective one of the first pair of transistors and a respective one of the second pair of transistors; and
a first current source coupled to the first pair of transistors and the second pair of transistors;
wherein the respective pairs of the plurality of input signals to be received by the first pair of the plurality of pulse generators are complements of each other, and wherein the respective pairs of the plurality of input signals to be received by the second pair of the plurality of pulse generators are complements of each other.

20. A pulse multiplexed output subsystem comprising:
a plurality of pulse generators, each of the plurality of pulse generators to receive a respective pair of a plurality of input signals;
a first differential transistor pair, wherein a gate of each transistor in the first differential transistor pair is coupled to an output of a respective one of a first pair of the plurality of pulse generators;
a second differential transistor pair, wherein a gate of each transistor in the second differential transistor pair is coupled to an output of a respective one of a second pair of the plurality of pulse generators;
a first pair of resistive loads, each resistive load in the first pair of resistive loads coupled to a respective transistor in the first differential transistor pair and a respective transistor in the second differential transistor pair; and
a first current source coupled to the first differential transistor pair and the second differential transistor pair;
wherein the respective pairs of the plurality of input signals to be received by the first pair of the plurality of pulse generators are complements of each other, and wherein the respective pairs of the plurality of input signals to be received by the second pair of the plurality of pulse generators are complements of each other.

* * * * *